United States Patent [19]

Stikvoort

[11] Patent Number: 4,584,659
[45] Date of Patent: Apr. 22, 1986

[54] DECIMATION FILTER ARRANGEMENT

[75] Inventor: Eduard F. Stikvoort, Eindhoven, Netherlands

[73] Assignee: U.S. Philips Corporation, New York, N.Y.

[21] Appl. No.: 510,810

[22] Filed: Jul. 5, 1983

[30] Foreign Application Priority Data

Jul. 5, 1982 [NL] Netherlands .................. 8202687

[51] Int. Cl.[4] .............................................. G06F 7/38
[52] U.S. Cl. ................................................ 364/724
[58] Field of Search ................ 364/724, 723; 333/165, 333/166

[56] References Cited

U.S. PATENT DOCUMENTS

| | | | |
|---|---|---|---|
| 3,928,755 | 12/1975 | Bellanger et al. | 364/724 |
| 3,997,773 | 12/1976 | Van Essen et al. | 364/724 |
| 4,020,332 | 4/1977 | Crochiere et al. | 364/723 |
| 4,131,764 | 12/1978 | Claasen et al. | 364/726 |
| 4,224,585 | 9/1980 | Tanaka | 333/165 |
| 4,344,149 | 8/1982 | Van de Meeberg et al. | 364/724 |
| 4,374,426 | 2/1983 | Burlage et al. | 364/724 |
| 4,460,890 | 7/1984 | Busby | 364/723 |

FOREIGN PATENT DOCUMENTS

| | | | |
|---|---|---|---|
| 1186751 | 5/1985 | Canada | 364/724 |
| 0052847 | 6/1982 | European Pat. Off. | 364/724 |

OTHER PUBLICATIONS

Rabiner et al.: *Theory and Application of Digital Signal Processing*, Prentice-Hall Publishing Co., 1975, pp. 541-544.

Rabiner et al.: "A Digital Signal Processing Approach to Interpolation", *Proceedings of the IEEE*, vol. 61, No. 6, Jun. 1973, pp. 692-702.

Primary Examiner—James D. Thomas
Assistant Examiner—Dale M. Shaw
Attorney, Agent, or Firm—Thomas A. Briody; William J. Streeter; Leroy Eason

[57] ABSTRACT

A decimation filter arrangement for reducing the sampling frequency of a time-discrete input signal from $f_i$ to $f_u$, $f_u$ not being a rational portion of $f_i$. For the generation of the required filter coefficients this arrangement comprises clock pulse generators producing first clock pulses ki(.) at a rate $f_i$ and second clock pulses au(.) at a rate $f_u$. The arrangement also comprises a coefficients generator in which a deviation component $d_n$ is calculated which indicates the ratio between the time interval located between a clock pulse au(.) and the immediately preceding clock pulse ki(.), and the time interval $1/f_i$ between two consecutive clock pulses ki(.). In response to this deviation component this coefficients generator produces N vilter coefficients, the $m^{th}$ filter coefficient, $m=0, 1, 2, \ldots N-1$, being equal to $a_n(m)=h[(d_n+m-)V_o]$. Herein the function h(v) represents the impulse response of an FIR-filter, v a continuous variable in the interval $-\infty < v < \infty$ and $V_o$ a predetermined constant.

5 Claims, 11 Drawing Figures

DECIMATION FILTER ARRANGEMENT

A. BACKGROUND OF THE INVENTION

A(1). Field of the Invention

The invention relates to a decimation filter arrangement for reducing the sampling frequency of a time-discrete input signal from $f_i$ to $f_u$. This input signal is formed by a sequence of input components which occur with the input sampling frequency $f_i$. This input signal is converted into a time-discrete output signal consisting of a sequence of output components which occur with the output sampling frequency $f_u$. A component of the input signal or output signal is to be understood to mean a quantity which characterizes the magnitude of an (analog) signal at a given instant. This quantity may assume any value in a predetermined interval or only a plurality of discrete values. In the latter case, the signal is commonly referred to as a digital signal and the component is usually represented by a code word comprising a number of bits.

A(2). Description of the Prior Art

Arrangements of the above-described type have been known for many years already. For further information, reference is made, for the sake of brevity, to references 1, 2, 3 and 4 of paragraph C. From these references it can be seen that such an arrangement produces an output signal whose output sampling frequency is a rational portion 1/M of the input sampling frequency; i.e. $f_u = f_i/M$, wherein M is an integer.

A practical implementation of a decimation filter arrangement is extensively described in, for example, reference 3. In order to get a clear picture of the operation of the known arrangement, the $q^{th}$ component of the input signal will hereinafter be designated x(q), wherein $q = \ldots -2, -1, 0, 1, 2, 3, \ldots$ and the $n^{th}$ component of the output signal will be designated y(n), wherein $n = \ldots -2, -1, 0, 1, 2, 3, \ldots$. This prior art decimation filter arrangement comprises a signal store for storing N consecutive components of the input signal. In addition, it comprises a soefficient store in which a group of filter coefficients is stored, which group comprises N filter coefficients and wherein the $m^{th}$ filter coefficient will be designated a(m), wherein $m = 0, 1, 2, \ldots N-1$. This group of filter coefficients represents the finite impulse response of an FIR filter. In a multiplying arrangement the N input components stored in the signal store are each multiplied by an associated filter coefficient and the N products obtained are added together. The sum component obtained thereby represents an output components. More specifically, the relationship between the $n^{th}$ output component y(n) of the filter arrangement and the input components can mathematically be described as follows:

$$y(n) = \sum_{m=0}^{N-1} x(nM - m)a(m) \quad (1)$$

From the above expression (1) it follows that the reduction factor M can only be an integer because otherwise nM-m is not an integer and because x(q) is only defined for integral values of q.

It should be noted that a change of the sampling frequency with a rational number L/M, wherein both L and M are integers, can be realised by arranging an interpolation filter arrangement which has an interpolation factor L in cascade with the decimation filter arrangement which has a decimation factor M. This is described extensively in the references 1 and 3. Reference 4 describes a decimation filter arrangement wherein in a particularly efficient manner a change of the sampling frequency with the rational factor L/M can be realised.

In practice it has been found that the are situations in which the sampling frequency of a signal must be changed by an irrational factor (for example $1/\sqrt{2}$. Such a situation occurs, for example, in digital audio equipment which must be intercoupled, for example, a digital tuner, a digital tape recorder, a digital pick-up apparatus, etc. In practice, these equipments each comprise there own clock pulse generators for generating the required sampling pulses. The frequencies of the clock pulse generators will never exactly be equal to each other and in practice cannot be made equal to each other. In order to render it possible for these equipments to co-operate with each other, the sampling frequency of the digital signal applied by a first equipment to a second equipment must be adapted to the sampling frequency of the second equipment.

B. SUMMARY OF THE INVENTION

The invention has for its object to provide a decimation filter arrangement for reducing the sampling frequency $f_i$ of a time-discrete input signal by an irrational factor R, (where $R < 1$), so that a time-discrete output signal y(n) is obtained whose output sampling frequency $f_u$ is equal to $f_u = Rf_i$.

To that end the arrangement in accordance with the invention comprises:

(a) a filter input for receiving the input signal;

(b) first means for producing first clock pulses ki(q) at a rate $f_i$, $q = \ldots -2, -1, 0, 2, \ldots$;

(e) second means for producing second clock pulses au(n) at a rate $f_u$, $n = \ldots -2, -1, 0, 1, 2, \ldots$;

(d) a coefficients generator for producing a group of filter coefficients, which group comprises N filter coefficients, N being a predetermined integer, the generator being controlled by the first and the second clock pulses and comprising:

(d1) means to which the first and second clock pulses are applied wand which in response to each $n^{th}$ second clock pulse produces a deviation component $d_n$ the magnitude of which is proportional to the ratio between the time interval ($T_{ad(n)}$) between this $n^{th}$ second clock pulse and the immediately preceding or the immediately following first clock pulse and the time interval ($T_i$) between two consecutive first clock pulses ($0 \leq d_n \leq 1$);

(d2) means for generating, in response to the deviation component $d_n$ the N filter coefficients, the $m^{th}$ filter coefficient ($m = 0, 1, 2, \ldots N-1$) being equal to $a_n(m) = h[(d_n+m)V_o]$ wherein the function h(v) represents the impulse response of an FIR filter, v is a continuous variable in the interval $-\infty < v < \infty$ and $V_o$ is a predetermined constant, (e) a multiplying arrangement coupled to the filter output and to the coefficients genrrator and to which, in response to the $n^{th}$ second clock pulse, N consecutive input components x(r-m), wherein r represents an integer, and the N filter coefficients $a_n(m)$ are applied to multiply each of these N input components x(r-m) by an associated filter coefficient $a_n(m)$; and (f) an adding arrangment for adding together the N products $a_n(m).x(r-m)$ produced by the multiplying arrangement.

The relationship existing between the $n^{th}$ output component y(n) of this decimation filter arrangement and the input components can now be mathematically described as follows:

$$y(n) = \sum_{m=0}^{N-1} x(r - m) \cdot a_n(m) \qquad (2)$$

As will be seen from expression (1), the same group of filter coefficients is always used for calculating an output component y(n) of the prior art decimation filter arrangement. With the arrangement in accordance with the invention this group of filter coefficients changes continuously from output component to output component. This group of filter coefficients is characterized by the deviation component $d_n$.

C. REFERENCES

1. A digital Signal Processing Approach to Interpolation; R. W. Schafer, L. R. Rabiner; Proceedings of the IEEE, Vol. 61, No. 6., June 1973 pages 692–702.
2. Arrangement for converting discrete signals into a discrete single sideband frequency division-multiplex-signal and vice versa. U.S. Pat. No. 4,131,764 (PHN 8731) section E(1.2).
3. Digital filter; Netherlands Patent Application No. 74,00,761 (PHN 6883)
4. Interpolation Decimation Circuit for Increasing or Decreasing Digital Sampling Frequency; R. E. Crochiere, L. R. Rabiner; U.S. Pat. No. 4,020,332.
5. Theory and Application of Digital Signal Processing; L. R. Rabiner, B. Gold; Prentice-Hall INC 1975, ISBN 0-13-914101-4.

E. DESCRIPTION OF THE EMBODIMENTS

E(1). Theoretical background

Figure 1:
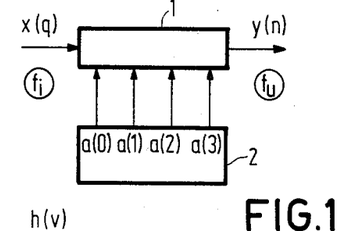
FIG. 1 shows schematically the construction of a time-discrete filter.

FIG. 1 shows schematically the construction of a time-discrete filter. This filter comprises a processing arrangement 1 and a coefficients generator 2. This generator produces a group of filter coefficients a(m), the group comprising N filter coefficients. Hereinafter let it be assumed that N=4 and that the group comprises the four filter coefficients a(0), ..., a(3). These are, in this case, each applied via a separate line to the processing arrangement 1. This processing arrangement also receives a time-discrete input signal which is formed by a sequence of inputs components x(q), q=... −2, −1, 0, 1, 2, ..., which occur with the input sampling frequency $f_i$. In response to the input components and the filter coefficients the processing arrangement 1 produces a time-discrete output signal which is formed by a sequence of output components y(n), n=... −2, −1, 0, 1, 2, ..., which occur with an output sampling frequency $f_u$. For a normal time-discrete filter $f_i = f_u$. The processing arrangement may however be of such a construction that $f_u > f_i$ or of such a construction that $f_u < f_i$. If $f_u > f_i$ then this time-discrete filter represents an interpolation filter arrangement, if, however, $f_u < f_i$ then it represents a decimation filter arrangement.

In all these cases it holds, however, that for calculating an output component y(n) a group of input components is selected, which group consists of N(=4) consecutive input components x(r−m) m=0, 1, 2, 3, (=N−1) and that each of these input components is multiplied by an associated filter coefficient a(m) whereby the four products x(r−m)a(m) are obtained. The mathematical sum of these four products represents an output component. As is generally known, the filter coefficients a(m) represent samples of a predetermined impulse response. In order to gain a proper understanding of the decimation filter arrangement, a short description will now be given, by way of remainder, how the filter coefficients of the desired impulse response are derived.

Figure 2:
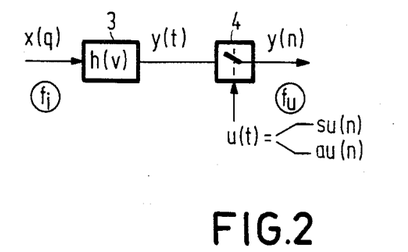
FIG. 2 shows schematically a theoretical model of a time-discrete filter.
Figure 3:
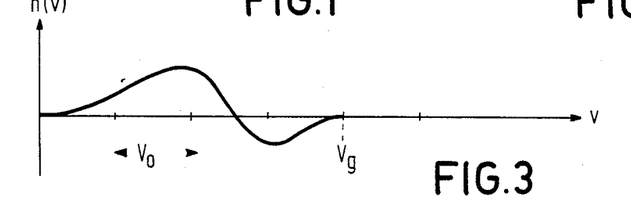
FIG. 3 shows a possible shape of the impulse reponse of an FIR-filter.

To that end FIG. 2 shows the theoretical model of the time-discrete filter of FIG. 1. In this model the time-discrete filter is represented by an "analog" filter 3, followed by a sampling device 4. A clock signal u(t) is applied to this sampling device 4 with a frequency $f_u$. The filter 3 has an impulse response h(v) which is defined for all values of v but which can only assume values which are unequal to zero in a finite interval. This filter 3 is therefore sometimes referred to as an FIR-filter (=Finite Impulse Response filter). Let it now be assumed that the impulse response of the filter 3 is unequal to zero in the interval $O < v < V_g$, wherein $V_g$ is proportional to $N/f_i = N\, T_i$. Let it further be assumed that this impulse response has the shape shown in FIG. 3 and that the input components x(q) occur at the instants $t_{ki(q)}$ as shown at A in FIG. 4. It then holds that $t_{ki(q)} - t_{ki(q-1)} = T_i$. In response to such an input component x(q) the filter 3 supplies an output signal $y_{x(q)}(t)$, which will be designated the individual output signal and which is defined by the expression:

$$y_{x(q)}(t) = x(q)h\,[(t - t_{ki(q)})V_g/(4T_i)] \qquad (3)$$

As is shown in expression (3), each individual output signal is equal to the product of the input component and an auxiliary signal which is formed by an impulse response version which is shifted in the time. Some of these auxiliary signals, namely those for q=−3, −2, −1, 0, 1, 2, are shown at D, E, F, G, H, I in FIG. 4. The actual output y(t) of the filter 3 is formed by the mathematical sum of all the individual output signals.

In the sampling device 4 this output signal y(t) is sampled at instants which are determined by the clock signal u(t). Sampling the output signal y(t) is of course equivalent to sampling each of the individual signals and adding together the signal samples thus obtained.

Figure 4:
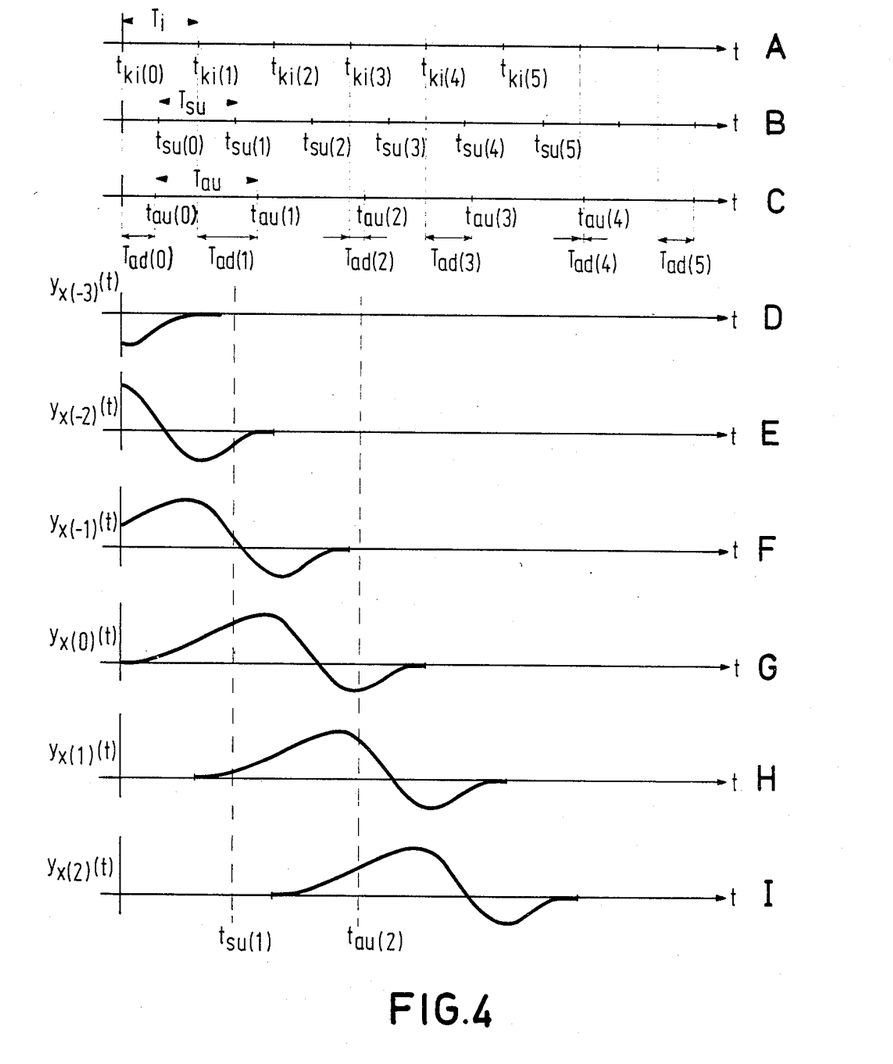
FIG. 4 shows some time diagrams to explain the time-discrete filter shown in FIG. 2.

Let it be assumed that the clock signal u(t) is formed by a sequence of clock pulses su(n) which occur with a rate $f_i$ and at instant $t_{su(n)}$ as they are shown at B in FIG. 4. As can be seen from FIG. 4, at such an instant only four of the individual signals are unequal to zero. So that it holds, for example for the instant $t=t_{su(1)}$ that:

$$
\begin{aligned}
y_{x(-2)}(t_{su(1)}) &= x(-2) \, h[(t_{su(1)} - t_{ki(-2)}) \, V_g/(4T_i)] \\
y_{x(-1)}(t_{su(1)}) &= x(-1) \, h[(t_{su(1)} - t_{ki(-1)}) \, V_g/(4T_i)] \\
y_{x(0)}(t_{su(1)}) &= x(0) \, h[(t_{su(1)} - t_{ki(0)}) \, V_g/(4T_i)] \\
y_{x(1)}(t_{su(1)}) &= x(1) \, h[(t_{su(1)} - t_{ki(1)}) \, V_g/(4T_i)]
\end{aligned}
\quad (4)
$$

If now the distance between a clock pulse su(n) and the immediately preceding input component is denoted by $T_{sd}$ and the quotient $V_g/N$ is designated by $V_O$, then the expression (4) changes into:

$$
\begin{aligned}
y_{x(-2)}(t_{su(1)}) &= x(-2) \, h[(T_{sd} + 3T_i) \, V_0/T_i] \\
y_{x(-1)}(t_{su(1)}) &= x(-1) \, h[(T_{sd} + 2T_i) \, V_0/T_i] \\
y_{x(0)}(t_{su(1)}) &= x(0) \, h[(T_{sd} + T_i) \, V_0/T_i] \\
y_{x(1)}(t_{su(1)}) &= x(1) \, h[(T_{sd}) \, V_0/T_i]
\end{aligned}
\quad (5)
$$

The four quantities $h[(T_{sd}+mT_i) \, V_O+T_i]$, $m=0, 1, 2, 3$, now represent the previously mentioned filter coefficients. If now the output sampling frequency $f_u$ is a rational portion of $f_i$, then it will be designated $f_{su}$, for which it then holds that $f_{su}=f_i/M$, wherein M is an integer, including one. In that case the time interval $T_{sd}$ is the same for each clock pulse su(n) so that for the calculation of each output component the same sequence of four filter coefficients may be used.

The situation is completely different when $f_u$ is not a rational portion of $f_i$. In that event the output sampling frequency will be designated $f_{au}$. The consequences thereof will now be further described. Let it be assumed that clock pulses au(n) are applied to the sampling device 4 with rate $f_{au}$ for which it holds, for example, that $f_{au}=f_i/Q\sqrt{2}$, wherein Q is some integer. These clock pulses occur at instants $t_{au(n)}$, a number of these clock pulses being shown at C in the time diagram of FIG. 4 for the event that q=1. Now let the time interval located between the instant $t_{au(n)}$ at which the clock pulse au(n) occurs and the instant at which the immediately preceding input component occurs be represented by $T_{ad(n)}$. From the diagram C it now appears that $T_{ad(n)}$ is not constant but differs from clock pulse to clock pulse. This will also cause the contribution of the different auxiliary signals to an output component to be different from output component to output component. Since the frequency $f_i$ is not a fixed quantity but differs from audio apparatus to audio apparatus it is useful to introduce a quantity $d_n$ which will be designated a deviation component and is defined as follows:

$$d_n = T_{ad(n)}/T_i \quad (6)$$

Let it now be assumed that directly preceding the $n^{th}$ clock pulse au(n) the $q^{th}$ input component x(q) occurs, then it holds at the instant $t_{au(n)}$ that:

$$
\begin{aligned}
y_{x(q-4)}(t_{au(n)}) &= 0 \\
y_{x(q-3)}(t_{au(n)}) &= x(q-3) \, h[(d_n+3) \, V_0] \\
y_{x(q-2)}(t_{au(n)}) &= x(q-2) \, h[(d_n+2) \, V_0] \\
y_{x(q-1)}(t_{au(n)}) &= x(q-1) \, h[(d_n+1) \, V_0] \\
y_{x(q)}(t_{au(n)}) &= x(q) \, h(d_n V_o)
\end{aligned}
$$

The quantities $h[(d_n+m)V_o]$, $m=0, 1, 2, 3$ now represent the filter coefficients which must be produce by the coefficients generator 2 in response to the $n^{th}$ clock pulse au(n). Hereinafter this quantity will be denoted by $a_n(m)$ so that $$a_n(m) = h[(d_n+m)V_o] \quad (7)$$

How all this can be realised in practice will be further described in section E(2).

E(2). SOME PRACTICAL EMBODIMENTS

Figure 5:
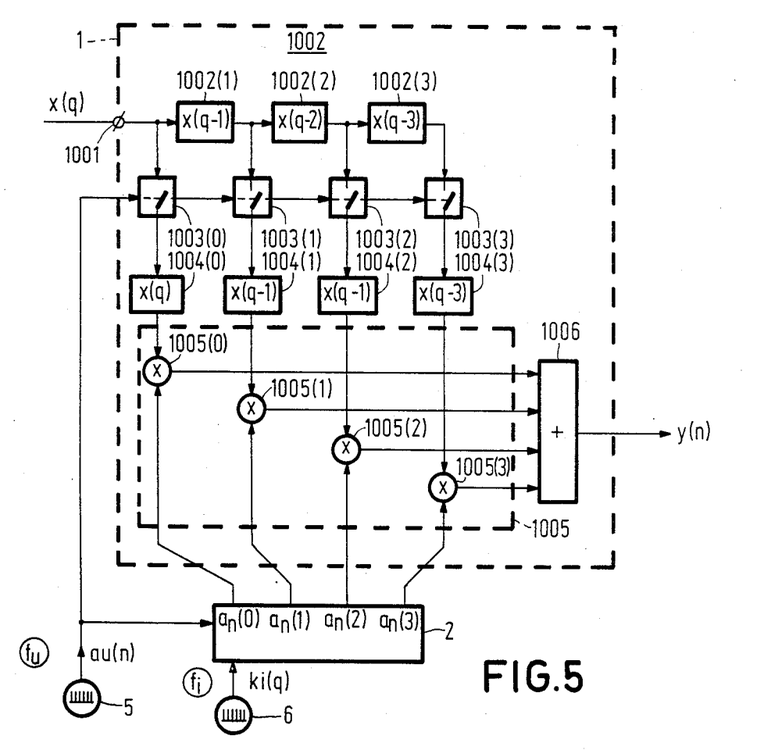
FIG. 5 shows an embodiment of the arrangement in accordance with the invention.

FIG. 5 shows schematically an embodiment of a decimation filter arrangement. This signal processing arrangement thereof has a filter input 1001, to which with a rate $f_i$ input components x(q), $q = \ldots -2, -1, 0, 1, 2, \ldots$ of a time-discrete input signal are applied. A shift register 1002 formed from N−1, in this case three, shift register elements 1002(.) is connected to this input 1001. An input component can be stored in each of these three shift register elements. In this shift register they are shifted at the rate $f_i$.

The filter input 1001 and the outputs of the shift register elements 1002(.) are connected via switches (shown symbolically only) 1003(.) to inputs of storage elements 1004(.). These switches are simultaneously controlled by the clock pulses au(n) which are produced by a clock pulse generator 5. Each time such a clock pulse occurs the content of the shift register elements 1002(.) is transferred to the associated stores 1004(.) and the input component applied at that instant to the filter input 1001. is transferred to the store 1004(0). FIG. 5 shows the situation in which, at the instant the clock pulse au(n) occurred the input component x(q) was present at the filter input 1001 and in the shift register elements 1002(.) the respective input components x(q−1), x(q−2), x(q−3) were present.

The input components x(q−m), m=0, 1, 2, 3 now present in the stores 1004(.), are each multiplied in a multiplying arrangement 1005 by an associated filter coefficient $a_n(m)$. For that purpose this multiplying arrangement 1005 comprises four multipliers 1005(.) which each receive an input component x(q−m) and an associated filter coefficient $a_n(m)$. Thus each multiplier produces a product x(q−m) $a_n(m)$.

The four products which are products by the multiplier in response to a clock pulse au(n) are added together in an adding arrangement 1006. This produces a sum component which represents an output component y(n) of the output signal.

The four filter coefficients $a_n(m)$ are generated by the coefficients generator 2 which is controlled by the clock pulses au(n) produced by clock pulse generator 5. The coefficients generator also receives clock pulses ki(q) which occur at a rate $f_i$. In the embodiment shown these last-mentioned clock pulses ki(q) are generated by a clock pulse generator 6, it being assumed that these clock pulses ki(q) occur at instants $t_{ki(q)}$, at which also the input components occur. (see A in FIG. 4). It is conceivable that these clock pulses ki(q) are supplied by the audio apparatus which also supplies that input components x(q).

Figure 6:
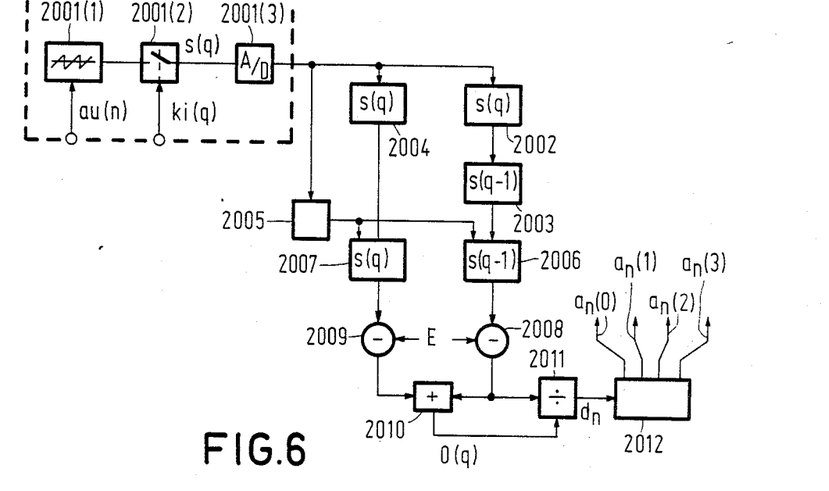
FIG. 6 shows an embodiment of a coefficients generator for use in the arrangement shown in FIG. 5.

As is described in the preceding paragraph the coefficients $a_n(m)$ are not only determined by the impulse reponse h(v), but also by the deviation component $d_n$ which indicate the relationship between the interval $T_{ad(n)}$, located between the instant $t_{au(n)}$ at which a clock pulse au(n) occurs, and the instant $t_{ki(.)}$ at which an immediately preceding clock pulse ki(.) occurs, and the interval $T_i$ between two consecutive clock pulses ki(.). A coefficients generator 2 in which in a particularly efficient way this deviation component $d_n$ is calculated and on the basis thereof the desired filter coefficient, is shown in FIG. 6. It comprises a, preferably digital, sawtooth generator 2001 which at a rate $f_i$ produces digitally coded samples of a periodic analog sawtooth-shape signal which has a period $T_{au}=1/f_{au}$. In order to consider a specific case, it may be assumed, as shown in FIG. 6, that this generator 2001 comprises a sawtooth generator 2001(1), which is controlled by the clock pulses au(n). This generator produces the analog sawtooth-shaped signal shown at A in FIG. 7 and which varies between the values $+E$ and $-E$ and whose value suddenly changes from $+E$ and $-E$ at the instant a clock pulse au(n) occurs. These clock pulses are shown again at B in FIG. 7.

The analog sawtooth-shaped signal thus obtained is thereafter applied to a sampling device 2001(2) in which it is sampled at instants $t_{ki(.)}$, which coincides with the instants at which the clock pulses ki(.) occur. For the sake of completeness, these instants are shown again at C in FIG. 7. This sampling device now produces the signal samples s(.) which are shown at A in FIG. 7 by means of arrows. How the deviation component can now be determined will be further described with reference to FIG. 7.

Figure 7:
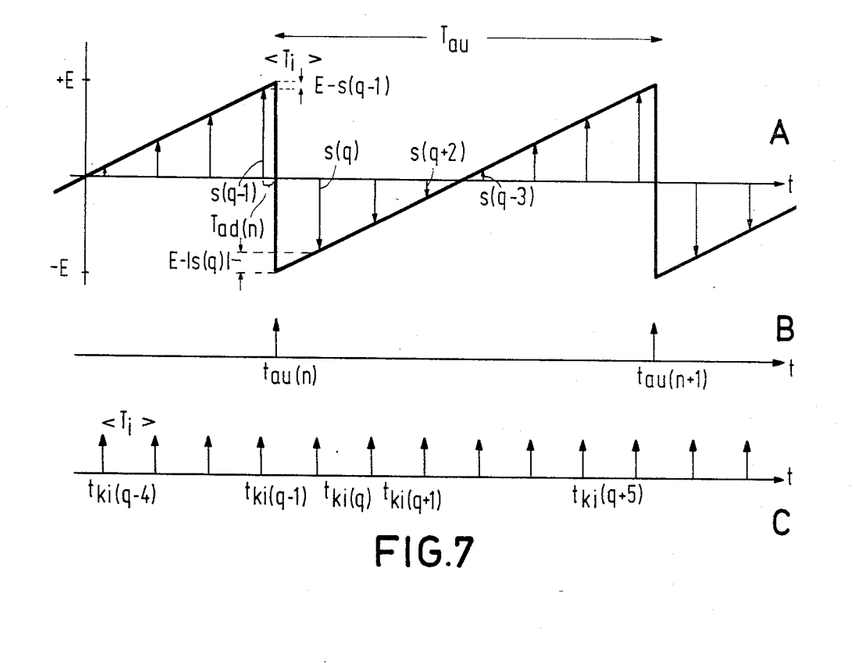
FIG. 7 shows some time diagrams to described the operation of the coefficients generator shown in FIG. 6.

Let it be assumed that the clock au(n) occurs between the two consecutive clock pulses ki(q−1) and k(q), $T_i$ being the distance between these two clock pulses. The distance between au(n) and ki(q−1) is the distance $T_{ad(n)}$ looked for. Let it further be assumed that the signal samples taken at the instants $t_{ki(q−1)}$ and $t_{ki(q)}$, respectively, of the sawtooth-shaped signal are equal to s(q−1) and s(q), respectively, then it follows from the planimetry that:

$$T_{ad(n)}:(T_i-T_{ad(n)})=(E-s(q-1)):(E-|s(q)|) \quad (8)$$

so that $$d_n = \frac{T_{ad(n)}}{T_i} = \frac{E-s(q-1)}{(E-s(q-1))+(E-|s(q)|)} = \frac{E-s(q-1)}{0(q)} \quad (9)$$

As can be seen from this expression (9), $d_n$ can be wholly determined from the size of the signal samples of the sawtooth-shaped signal. As is further shown in FIG. 6, these signal samples s(.) are applied for this purpose to a cascade arrangement of two shift register elements 2002 and 2003 and to a shift register element 2004. In known manner clock pulses which occur at a rate $f_i$ are applied to these shift register elements. The signal samples s(.) are also applied to a zero-crossing detector circuit 2005 which produces a detector pulse each time a signal sample s(q) has a negative polarity and the preceding signal same s(q−1) has a positive polarity. This detector pulse is applied to the clock pulse inputs of two further shift register elements 2006 and 2007. The signal inputs thereof are connected to the signal outputs of the shift register elements 2003 and 2004, respectively. In response to this detector pulse the content of the shift register elements 2006 and 2007 becomes equal to s(q−1) and s(q), respectively. In subtracting arrangements 2008 and 2009 the absolute value of these signal samples are substracted from the number E. The two difference components obtained thereby are added together in an adder arrangement 2010 and in a divider stage 2011 the difference component supplied by subtracting arrangement 2008 is divided by the sum component 0(q) thus obtained. The deviation component $d_n$ thus obtained is applied to a calculating arrangement 2012 (for example a microcomputer) which is arranged for calculating, from the values of $d_n$, four values of the function h(v) for the four arguments $v=(d_n+m)V_0$ wherein m=0, 1, 2, 3. The four function values $h[(d_n+m)V_0]$ obtained thereby represent the four filter coefficients $a_n(m)$.

E(3). SPECIAL EMBODIMENTS

Figure 8:
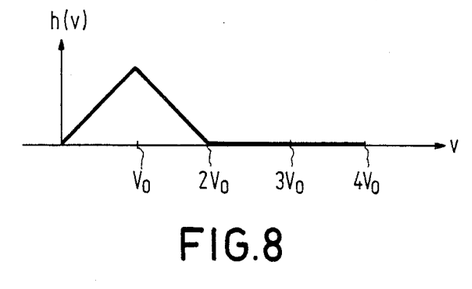
FIG. 8 shows another shape of an impulse response.

As in the coefficients generator whose embodiment is shown in FIG. 6 no restriction whatsoever is imposed on the shape of the impulse response h(v), a microcomputer 2012 is required in order to calculate the four filter coefficients, starting from the deviation component $d_n$. In certain circumstances the use of a microcomputer is not necessary. This is, for example, the case when the impulse response has the shape shown in FIG. 8 and is defined as follows:

$$\begin{aligned} h(v) &= 0 & \text{for } v \leq 0 \text{ and } v \geq 2V_0 \\ h(v) &= v & \text{for } 0 < v \leq V_0 \\ h(v) &= 2V_0 - v & \text{for } V_0 < v < 2V_0 \end{aligned} \quad (10)$$

with expression (7) it then follows that:

$$\begin{aligned} a_n(0) &= d_n V_0 \\ a_n(1) &= (1-d_n) V_0 \\ a_n(2) &= 0 \\ a_n(3) &= 0 \end{aligned} \quad (11)$$

Then $d_n$ follows from expression (9) and it holds that:

$$1 - d_n = \frac{E-|s(q)|}{(E-s(q-1))+(E-|s(q)|)} = \frac{E-|s(q)|}{0(q)}$$

Figure 9:
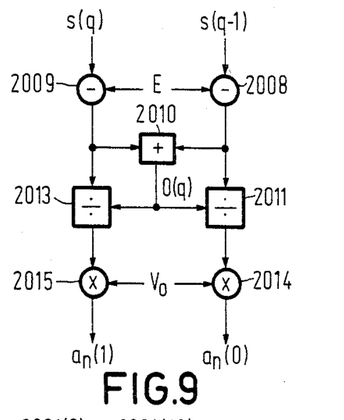
FIG. 9 shows the modification which can be made in the coefficients generator of FIG. 6, for the case the impulse response has the shape shown in FIG. 8.

Put differently, the factor $(1-d_n)$ can be obtained by dividing the output signal of the subtractig arrangement 2009 (see FIG. 6) by the sum component 0(q) produced by the adder arrangement 2010. For the sake of completeness, this is shown schematically in FIG. 9. As is shown in this Figure, the output signal of the subtracting arrangement 2009 is applied to a divider stage 2013 which also receives the sum component 0(q) from the adder arrangement 2010. The output components of the two divider stages 2011 and 2013 are multiplied in multiplying stages 2014 and 2015 by the constant factor $V_0$.

As in this case the sum component 0(q) is present in both $d_n$ and $1-d_n$, the following procedure can be followed. Choose the filter coefficients as follows:

$$a_n(0)=E-s(q-1)$$

$$a_n(1)=E-|s(q)|$$

$$a_n(2)=0$$

$$a_n(3)=0$$

Adder arrangement 1006 (see FIG. 5) now supplies output components y'(n). Apply these components to a multiplying arrangement in which they are multiplied by $V_0/0(q)$. This results in the desired output components y(n).

Figure 10:
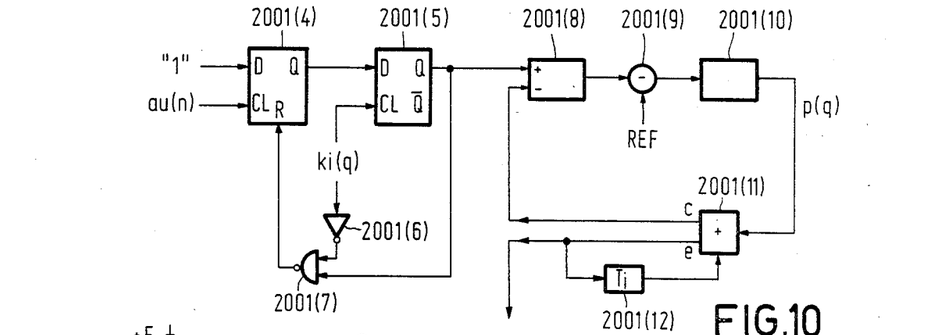
FIG. 10 shows a digital sawtooth generator for use in the coefficients generator shown in FIG. 6.

In the coefficients generator shown in FIG. 6 the signal samples s(q) are obtained by sampling an analog sawtooth-shaped signal. A sawtooth generator generating these signal samples wholly digitally is shown in FIG. 10. It comprises an input circuit incorporating a D-flip-flop 2001 (4). The D-input of this flip-flop continuously receives the logic value "1". The clock input CL receives the clock pulses au(n) and the reset-input R receives a reset signal. The Q-output of this D-flip-flop 2001(4) is connected to the D-input of a D-flip-flop 2001(5). The clock pulses ki(q) are applied to the clock pulse input CL of this D-flip-flop. The pulses occurring at the φ output of the D-flip-flop 2001(5) and the clock pulses ki(q) inverted in an inverter 2001(6) are applied to a NANO-gate 2001(7) whose output pulses are applied as reset pulses to the reset input R of D-flip-flop 2001(4). This input circuit formed by two D-flip-flops may, for example, be the Dual D-flip-flop of the "74" series marketed by Signetics. The output pulses of D-flip-flop 2001(5) are applied to a phase-locked loop (PLL) which is implemented in digital form. This phase-locked loop comprises an up/down counter 2001(8) the counting range of which is located in the range 0−2E. The output pulses of the D-flip-flop 2001(5) are applied to the up-counting input (+) of the counter. The counting position of this counter 2001(8) is applied at intervals $T_i$ to a digital low-pass filter 2001(10) via a subtracting arrangement 2001(9). In the subtracting arrangement 2001(9) the counting position is reduced by a reference number REF which is, for example, equal to half (E) the range (2E) of counter 2001(8).

The low-pass filter 2001(10) which has a bandwidth than less of 1 Hz, supplies at a rate $f_i$ output components p(q) which are applied to an accumulator formed by a adder 2001(11) and a delay network 2001(12) whose time delay is equal to $T_i$. Adder 1001(11) has two outputs denoted by c and e, respectively. At the output c there occurs the (most significant) carry-bit of the work supplied by the adder, while the remaining bits of this word occur at the output e. The output c is connected to the down-counting input (−) of the up/down counter 2001(8) and the output e represents the output of the sawtooth generator.

E.(4). FINAL REMARKS

1. In the embodiments shown in the FIGS. 1 and 5 it was assumed that the coefficients generators 2 is of such a construction that it produces the four filter coefficients simultaneously. If, however, this coefficients generator comprises a microcomputer as assumed in FIG. 6, then the filter coefficients will, normally speaking, be supplied sequentially. In this case it is advantageous to couple, in the manner described, for example, in chapter 9.2 of reference 5, the stores 1004(.) shown in FIG. 5 to each other, so that a circulating shift register is obtained. The output thereof may then be connected to one single multiplier to which then also the filter co-efficients are serially applied. An accumulator which adds N consecutive products together is then connected to the output of this multiplier.

Figure 11:
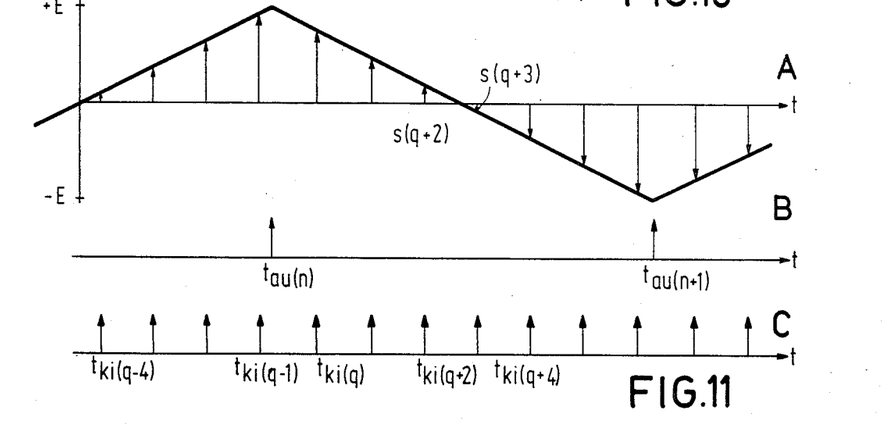
FIG. 11 shows some time diagrams to describe in more detail a further construction of the coefficients generator.

2. In the foregoing it was assumed that the generator 2001 produces a sawtooth-shaped signal. It is, however, alternatively possible to construct this generator in such a way that it produces a signal which varies triangularly in the manner as shown in, for example, FIG. 11. To determine the deviation component $d_n$ the two signal samples s(q+2) and s(q+3) may now be taken as the starting point. This is also possible for the situation outlined in FIG. 7, in which a sawtooth-shaped signal is involved.

3. The present invention may be considered as follows. The time interval $T_i$ between two consecutive clock pulses ki(.) is divided into an infinite number of subinvervals $T_{io}$ which are infinitely narrow. Thereafter it is determined between which two consecutive clock pulses ki(.). the clock pulse au(n) is located and also in which subinterval. The number of this subinterval represents the deviation component $d_n$. The number of sub-intervals now depends on the number of bits with which it is desired to represent $d_n$. If this number of bits is chosen to be such that a countable number of sub-intervals is obtained, the following procedure can be followed. The values which the impulse response assumes at all sub-intervals are stored in a storage medium. Let it be assumed that the number of subintervals is sixteen, then this storage medium contains, for example, 16 N filter coefficients. Connected to this storage medium there is a selector to which the deviation component $d_n$ is applied and which, depending on the magnitude of $d_n$, selects the desired N filter coefficients from these 16N filter coefficients. In such cases the term "table-loop up" is sometimes used.

What is claimed is:

1. A decimation filter for converting a time-discrete input signal having a sampling frequency $f_i$ to a time-discrete output signal having a sampling frequency $f_u$, such input signal consisting of sequential components x(q), q=. . . −2, −1, 0, 1, 2, . . . , and such output signal consisting of sequential components y(n), n=. . . −2, −1, 0, 1, 2, . . . , the ratio $f_u/f_i$ being irrational; such filter comprising:

(a) means for producing a first sequence of clock pulses ki(q) at said rate $f_i$;

(b) means for producing a second sequence of clock pulses au(n) at said rate $f_u$;

(c) filter coefficient genrating means for producing a group of N filter coefficients, N being a predetermined integer, such soefficient generating means comprising:

(c1) deviation component generating means connected to the first and second clock pulse generating means and which, in response to each $n^{th}$ second sequence clock pulse, produces a deviation component $d_n$ of a magnitude proportional to the ratio between the time interval Tad(n) between such $n^{th}$ second sequence clock pulse and the first clock pulse closest thereto; such deviation component generating means comprising:

means for gernating at a sampling rate $f_i$ samples of a periodic signal having a period $1/f_u$ and which linearly varies between two limit values, selection means connected to said periodic signal sample generating means for selecting those two consecutive periodic signal samples of which one is above and the other is below a predetermined threshold value, subtracting means connected to said selection means for forming two difference components, the first such difference component being equal to the difference between said first limit value and the magnitude of the first of said selected consecutive periodic signal samples and the second such difference component being equal to the difference between said second limit value and the magnitude of the second of said selected consecutive periodic signal samples, adding means connected to said subtracting means for deriving the sum of said two difference components, and dividing means connected to said adding means for producing the deviation component $d_n$ by dividing one of the difference components by the sum of both of said difference components;

(c2) and calculating means connected to said deviation component generating means and responsive to the deviation component $d_n$ produced thereby to produce said group of N filter coefficients in accordance with the relation $$a_n(m) = h[(d_n + m)V_O]$$

wherein $m = 0, 1, 2, \ldots N-1$, $a_n(m)$ is the $n^{th}$ filter coefficient of the group of N filter coefficient to be produced following occurrence of the $n^{th}$ first sequence clock pulse, $h[(d_n+m)V_O]$ is the impulse response $h(v)$ of a FIR-filter, v being a continuous variable, and $V_O$ is a predetermined constant;

(d) a multiplying arrangement coupled to the output of said filter and to said coefficient generator and to which is applied, in response to the $n^{th}$ second sequence clock pulse, N consecutive components $x(r-m)$ of the input signal $x(n)$, r being an integer, and the N filter coefficients $a_n(m)$ produced by the coefficient generator; such multiplying arrangement being adapted to multiply each input signal component $x(r-m)$ by an associated filter coefficient $a_n(m)$;

(e) and an adding arrangement coupled to said multiplying arrangement for adding the N products $a_n(m).x(r-m)$ produced thereby, the sum of such N products being the filter output signal component $y(n)$.

2. A filter as claimed in claim 1, wherein said FIR-filter impulse response $h(v)$ is defined by the relations
$h(v) = 0$, for $V < 0$ and $v > 2V_O$
$h(v) = v$, for $0 \leq v \leq V_O$
$h(v) = 2V_O - N$, for $V_O \leq v \leq 2V_O$ 3. A filter as claimed in claim 1, wherein said dividing means comprised in said deviation component generating means divides the second of sid difference components by the sum of both of said difference components.

4. A filter as claimed in claim 1, wherein said periodic signal has a sawtooth waveform.

5. A filter as claimed in claim 1, wherein said two limit values are of equal magntiude and opposite polarity, said predetermined threshold value is zero, and the first and second of the two selected consecutive periodic signal samples are positive and negative, respectively.

* * * * *